United States Patent
Li et al.

(10) Patent No.: US 7,531,207 B2
(45) Date of Patent: *May 12, 2009

(54) MOCVD PGO THIN FILMS DEPOSITED ON INDIUM OXIDE FOR FERAM APPLICATIONS

(75) Inventors: Tingkai Li, Vancouver, WA (US); Sheng Teng Hsu, Camas, WA (US); Bruce D. Ulrich, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 917 days.

This patent is subject to a terminal disclaimer.

(21) Appl. No.: 10/780,919

(22) Filed: Feb. 17, 2004

(65) Prior Publication Data

US 2005/0178656 A1   Aug. 18, 2005

(51) Int. Cl.
*B05D 5/12* (2006.01)
*C23C 16/00* (2006.01)
(52) U.S. Cl. .............. 427/100; 427/248.1; 427/255.35
(58) Field of Classification Search .............. 427/100, 427/248.1, 255.35
See application file for complete search history.

(56) References Cited

U.S. PATENT DOCUMENTS

| 5,524,092 | A  | * | 6/1996  | Park ............................. 365/145 |
| 6,387,712 | B1 | * | 5/2002  | Yano et al. ..................... 438/3 |
| 6,407,422 | B1 | * | 6/2002  | Asano et al. ................. 257/306 |
| 6,475,813 | B1 | * | 11/2002 | Li et al. ......................... 438/3 |
| 6,483,137 | B2 | * | 11/2002 | Li et al. ...................... 257/295 |
| 6,664,116 | B2 | * | 12/2003 | Li et al. ......................... 438/3 |
| 7,157,111 | B2 | * | 1/2007  | Li et al. ...................... 427/100 |

OTHER PUBLICATIONS

IBM Technical Dislcosure Bulletin, vol. 19, issue No. 10, Mar. 1977, pp. 3937-3941.*

* cited by examiner

*Primary Examiner*—Brian K Talbot
(74) *Attorney, Agent, or Firm*—David C. Ripma

(57) ABSTRACT

Methods of forming depositing a ferroelectric thin film, such as PGO, by preparing a substrate with an upper surface of silicon, silicon oxide, or a high-k material, such as hafnium oxide, zirconium oxide, aluminum oxide, and lanthanum oxide, depositing an indium oxide film over the substrate, and then depositing the ferroelectric film using MOCVD.

2 Claims, 4 Drawing Sheets

MOCVD PGO THIN FILMS DEPOSITED ON INDIUM OXIDE FOR FERAM APPLICATIONS

BACKGROUND OF THE INVENTION

The present invention relates to MOCVD thin films, and thin film processes, and more particularly to films and processes used in connection with ferroelectric non-volatile memory devices.

One-transistor ferroelectric memory devices have been fabricated with Metal/Ferroelectric/Oxide/Silicon (MFOS) structures and Metal/Ferroelectric/Metal/Oxide/Silicon (MFMOS) structures. Due to leakage currents through the ferroelectric and oxide capacitors, the floating gate or channel can be neutralized, which results in poor charge retention properties for one-transistor ferroelectric memory devices.

DETAILED DESCRIPTION OF THE INVENTION

Methods are provided for depositing PGO thin films, preferably with c-axis orientation, on indium oxide thin films to enable the formation of Metal/Ferroelectric/Indium oxide/Silicon or Metal/Ferroelectric/Indium oxide/Silicon Oxide/Silicon or similar structures for use in FeRAM devices. The silicon oxide may be replaced with a high-k gate dielectric material for example.

Figure 1:
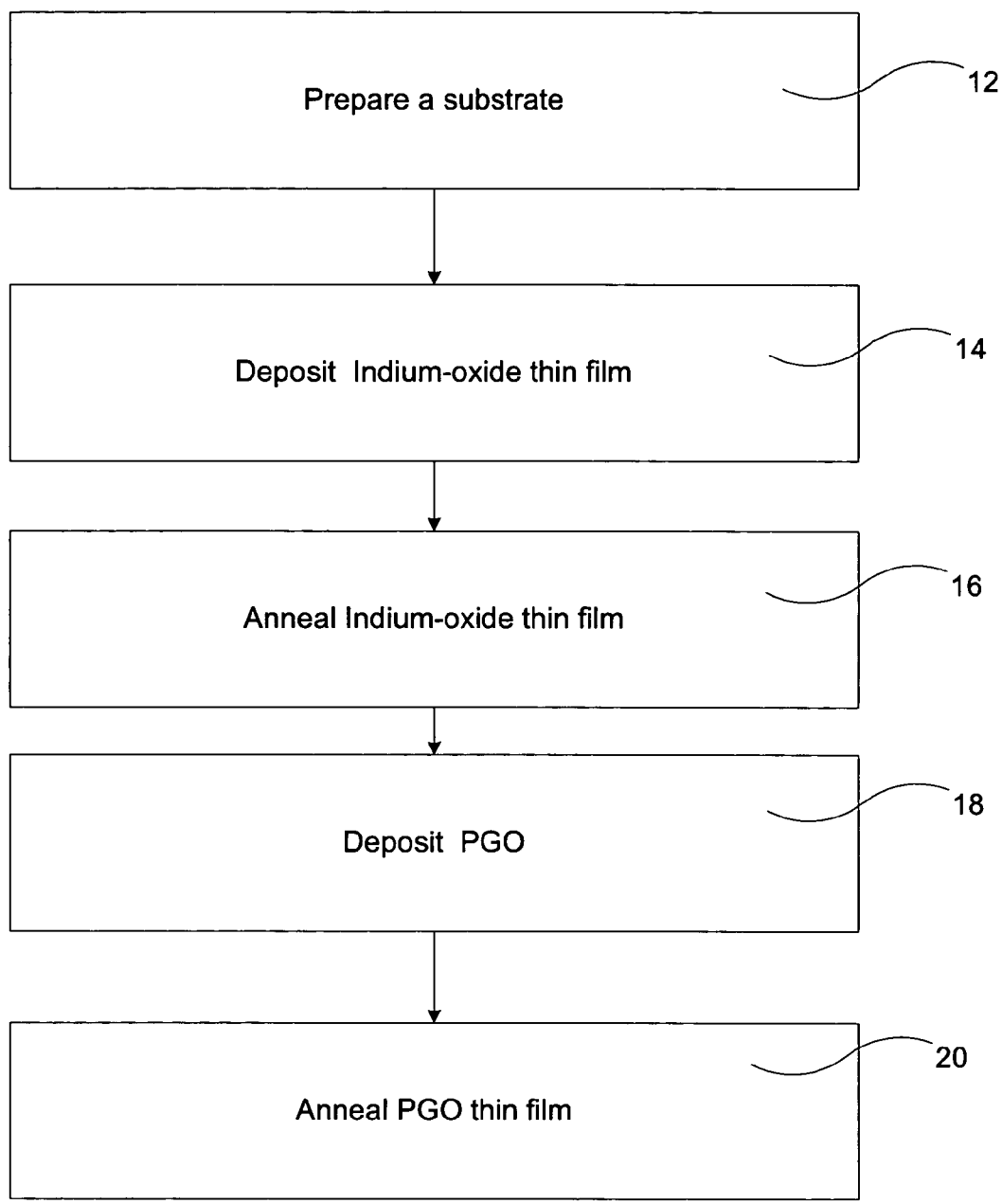
FIG. 1 is a block diagram showing a method of forming a PGO thin film on indium oxide.

The steps of a method of depositing PGO thin films on an indium oxide thin film are shown generally in FIG. 1. As shown at step 12, a substrate is prepared. In an embodiment of the present method, the substrate is a silicon substrate, for example a P-type (100) silicon wafer. It would also be possible to use an N-type wafer or an SOI substrate. If the indium oxide is to be deposited directly onto a silicon substrate surface, the Si wafer is dipped in buffered HF, for example HF (50:1), for 5-20 seconds, prior to deposition of the indium oxide. If the indium oxide is to be deposited of silicon oxide, a layer of silicon oxide must be formed prior to deposition of the indium oxide. The silicon oxide may be thermally grown, or deposited onto the silicon substrate surface. The silicon oxide layer will preferably be between about 1 nm and 10 nm thick prior to indium oxide deposition. Alternatively, a layer of high-k gate material, such as hafnium oxide, zirconium oxide, aluminum oxide, or lanthanum oxide, may be deposited instead of the silicon oxide layer.

Once the substrate has been prepared, indium oxide is deposited as indicated by step 14. The indium oxide may be deposited by DC sputtering. The substrate is placed within a DC sputtering chamber along with an indium target. The DC sputtering chamber is set to provide between about 100 and 300 watts of DC sputtering power, while the backward power is maintained at less than 5%. The DC sputtering chamber is maintained at between about 1 torr and 10 torr during deposition, with an oxygen partial pressure of 0% to about 60%. The deposition temperature is set between about 20° C. and 300° C. The substrate has a substrate temperature of between about 20° C. and about 300° C. The indium oxide is post-deposition annealed, as indicated by step 16, at a temperature of between about 400° C. and 800° C. for between about 5 minutes and 60 minutes, in a 20% to 100% oxygen atmosphere.

Once the indium oxide layer has been deposited and annealed. A ferroelectric layer is deposited using an MOCVD process. The ferroelectric layer may for example be lead germanium oxide (PGO). To deposit PGO onto the indium oxide layer, as indicated by step 18, the substrate is placed in an MOCVD chamber. A PGO precursor solution is prepared by dissolving Pb(thd)$_2$ and Ge(ETO)$_4$ at a molar ratio of between approximately 5:3 and 5.5:3 in a mixed solvent of butyl ether, or tetrahydrofuran, isoproponal and tetraglymer in a molar ratio of approximately 6-9:1-3:1-2, preferably 8:2:1. The precursor solution has a concentration in the range of about 0.05-0.5 M/L of PGO, preferably a concentration of about 0.1 M/L of PGO. The precursor solution is injected by a pump at a rate of approximately 0.05-0.5 ml/min into a vaporizer at a temperature in the range of between approximately 180° C. and 240° C. to form a precursor gas. The feed line should be kept at a temperature of between about 185° C. and 245° C. to reduce, or eliminate, deposition within the feed line. The precursor gas is introduced into the MOCVD chamber containing the substrate with the indium oxide layer. The MOCVD chamber is set to a temperature in the range of between approximately 400° C. and 540° C., at a pressure of between approximately 1 torr and 5 torr. The chamber is set with an oxygen partial pressure of between approximately 20 and 30 percent. The deposition time depends upon the desired thickness of the PGO film, but may be between 30 minutes and 180 minutes for example.

Following deposition of the PGO film, a post-deposition anneal is performed as indicated by step 20. The anneal is carried out at a temperature of between approximately 520° C. and 560° C. for between approximately 30 minutes and 1 hour, in an oxygen atmosphere.

Figure 2:
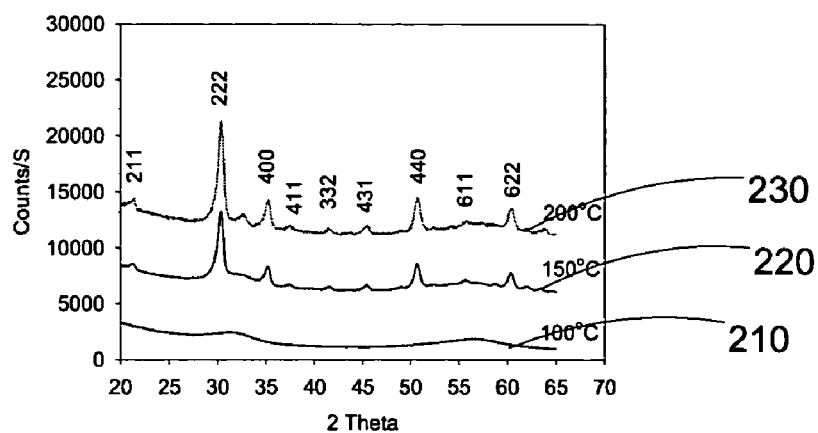
FIG. 2 shows x-ray diffraction patterns for indium oxide films on a silicon substrate.

FIG. 2 shows the x-ray pattern of indium oxide thin films deposited on silicon using different substrate temperatures. X-ray pattern 210 was taken for a film deposited on silicon at a substrate temperature of 100° C. X-ray pattern 220 was taken for a film deposited on silicon at a substrate temperature of 150° C. X-ray pattern 230 was taken for a film deposited on silicon at a substrate temperature of 200° C. As higher substrate temperatures are used during deposition of the indium oxide thin films, the indium oxide films produced change from nano-crystalline structure to polycrystalline thin films.

Figure 3:
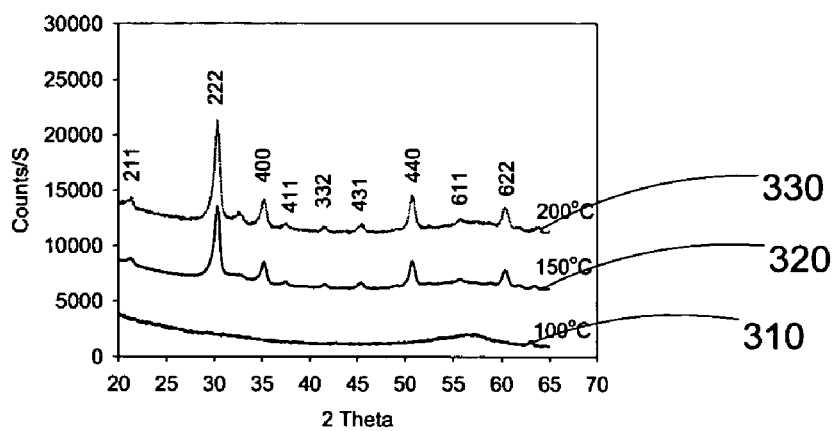
FIG. 3 shows x-ray diffraction patterns for indium oxide films on a silicon dioxide layer over a silicon substrate.

FIG. 3 shows the x-ray pattern of indium oxide thin films deposited on silicon oxide using different substrate temperatures. X-ray pattern 310 was taken for a film deposited on silicon oxide at a substrate temperature of 100° C. X-ray pattern 320 was taken for a film deposited on silicon oxide at a substrate temperature of 150° C. X-ray pattern 330 was taken for a film deposited on silicon oxide at a substrate temperature of 200° C. The results using silicon or silicon oxide are similar. In both cases, the grain sizes increase from approximately 3 nm for 100° C. substrate temperature to about 30 nm for 200° C. substrate temperature.

Figure 4:
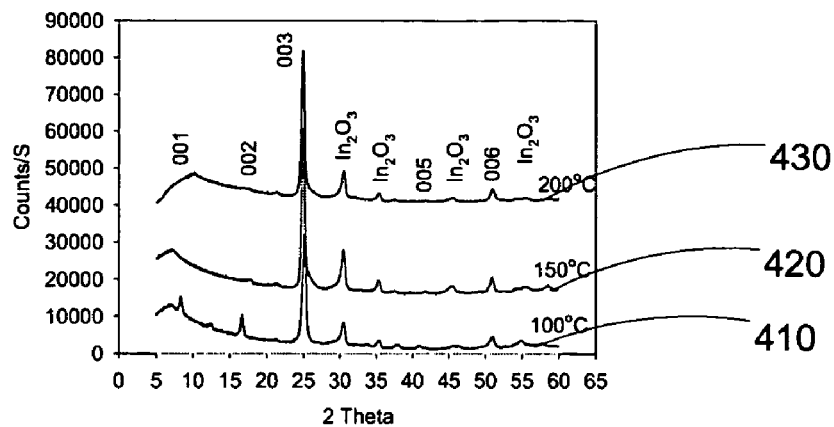
FIG. 4 shows x-ray diffraction patterns for PGO films formed over indium oxide films.

PGO films have been deposited using MOCVD, as described above, on indium metal as well as the indium oxide films produced at the 100° C., 150° C., and 200° C. as shown in FIGS. 2 and 3. PGO thin films deposited on indium oxide can be formed with more of a c-axis orientation. FIG. 4 shows the x-ray pattern of PGO films that have been deposited overlying the indium oxide films formed at 100° C., 150° C., and 200° C. X-ray pattern 410 was taken for a PGO thin film deposited on indium oxide, which had been deposited at a substrate temperature of 100° C. X-ray pattern 420 was taken for a PGO thin film deposited on indium oxide, which had been deposited at a substrate temperature of 150° C. X-ray pattern 430 was taken for a PGO thin film deposited on indium oxide, which had been deposited at a substrate temperature of 200° C. From these x-ray patterns, it appears that PGO thin films formed on indium oxide films deposited at approximately 150° C. have the highest c-axis orientation. Higher c-axis orientation is desired as it improves the ferroelectric properties of the resulting PGO thin film.

Figure 5:
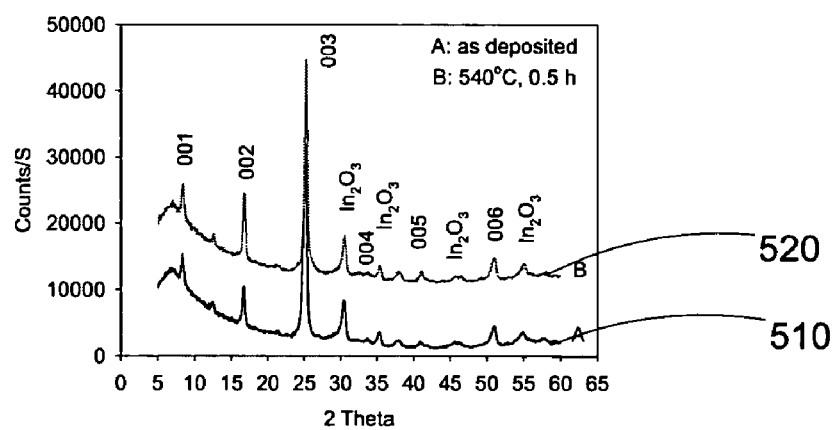
FIG. 5 shows x-ray diffraction patterns for PGO films formed over indium oxide films, as deposited and following annealing.

Post deposition annealing of the PGO thin film can improve the c-axis orientation of the deposited PGO thin film. The post deposition anneal may be at a temperature of between approximately 520° C. and 560° C. FIG. 5 shows the x-ray patterns for a PGO thin film as deposited, and then following a post-deposition anneal. X-ray pattern 510 shows an as deposited PGO thin film, which was deposited on indium oxide that had been deposited at a substrate temperature of 100° C. X-ray pattern 520 shows the same PGO thin film following approximately 30 minutes of annealing at approximately 540° C. in oxygen. The comparison of x-ray pattern 520 with x-ray pattern 510 indicates an increase in c-axis peaks for the PGO thin film following the anneal.

PGO thin films may be formed for example by depositing indium oxide on silicon, silicon oxide, or a high-k material under the following conditions:
    DC sputtering power: 150 W
    Oxygen partial pressures: 30%
    Substrate temperature: 150° C.-200° C.
    Post-annealing temperature: 500° C.-600° C.

and then using MOCVD to deposit a PGO thin film under the following process conditions:

Deposition Temp: 500° C.-510° C.
    Pressure: 2-5 torr
    Oxygen partial pressure: 20-30%
    Vaporizer temperature: 200° C.-205° C.
    Solution delivery rates: 0.1-0.2 ml/min
    Deposition time: 1-2 hours followed by an anneal at 540° C. for approximately 30 minutes in oxygen.

Figure 6:
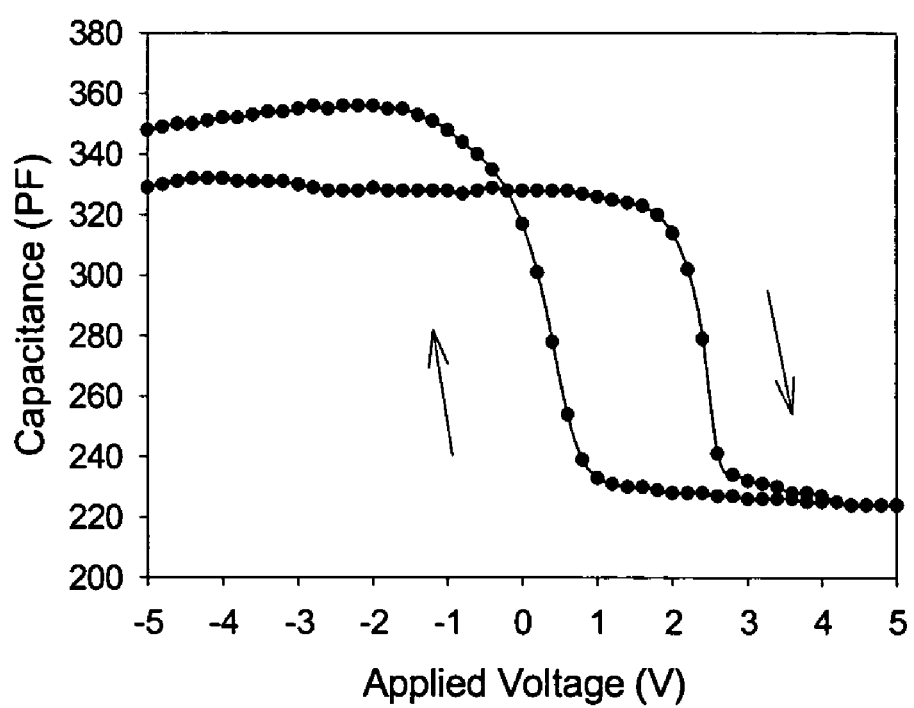
FIG. 6 shows CV curves for a Pt/PGO/Indium oxide/Si capacitor.

FIG. 6 shows CV curves of a capacitor formed by depositing indium oxide overlying silicon, and then depositing PGO overlying the indium oxide and forming a platinum top electrode overlying the PGO and then patterning and etching the Pt/PGO/indium oxide/Si layers. The resulting Pt/PGO/indium oxide/Si capacitor has a memory window that was measured to be approximately 2V based on the CV curves.

Several embodiments have been provided as examples. The scope of the present invention should not be limited to these examples, and shall be determined by the following claims.

What is claimed is:

1. A method of depositing a ferroelectric thin film comprising:
    preparing a substrate;
    forming a high-k layer overlying the substrate by depositing a high-k material selected from the group consisting of hafnium oxide, zirconium oxide, aluminum oxide, and lanthanum oxide;
    depositing an indium oxide film on the substrate; and
    depositing a ferroelectric material on the indium oxide thin film using MOCVD.

2. The method of claim 1, further comprising annealing the indium oxide film at a temperature between about 400° C. and about 800° C. for between about 5 minutes and about 60 minutes in an oxygen atmosphere.

* * * * *